United States Patent
Peng et al.

(10) Patent No.: US 10,018,698 B2
(45) Date of Patent: Jul. 10, 2018

(54) MAGNETIC RESONANCE RAPID PARAMETER IMAGING METHOD AND SYSTEM

(71) Applicant: SHENZHEN INSTITUTES OF ADVANCED TECHNOLOGY CHINESE ACADEMY OF SCIENCES, Shenzhen (CN)

(72) Inventors: Xi Peng, Shenzhen (CN); Dong Liang, Shenzhen (CN); Xin Liu, Shenzhen (CN); Hairong Zheng, Shenzhen (CN)

(73) Assignee: Shenzhen Institutes Of Advanced Technology Chinese Academy Of Sciences, Shenzhen, Guangdong (CN)

(*) Notice: Subject to any disclaimer, the term of this patent is extended or adjusted under 35 U.S.C. 154(b) by 284 days.

(21) Appl. No.: 15/103,845

(22) PCT Filed: Dec. 5, 2014

(86) PCT No.: PCT/CN2014/093168
§ 371 (c)(1),
(2) Date: Aug. 12, 2016

(87) PCT Pub. No.: WO2015/085889
PCT Pub. Date: Jun. 18, 2015

(65) Prior Publication Data
US 2016/0370444 A1  Dec. 22, 2016

(30) Foreign Application Priority Data
Dec. 10, 2013 (CN) .......................... 2013 1 0671860

(51) Int. Cl.
*G01V 3/00* (2006.01)
*G01R 33/561* (2006.01)
(Continued)

(52) U.S. Cl.
CPC .......... *G01R 33/561* (2013.01); *G01R 33/50* (2013.01); *G01R 33/5608* (2013.01); *G01R 33/5611* (2013.01)

(58) Field of Classification Search
CPC .. G01R 33/561; G01R 33/5611; G01R 33/50; G01R 33/5608
(Continued)

(56) References Cited

U.S. PATENT DOCUMENTS

| | | | | |
|---|---|---|---|---|
| 7,330,027 B2 * | 2/2008 | Kozerke | ............ | G01R 33/5611 324/307 |
| 9,709,650 B2 * | 7/2017 | Trzasko | ............. | G01R 33/5611 |

FOREIGN PATENT DOCUMENTS

| | | |
|---|---|---|
| CN | 101975936 | 2/2011 |
| CN | 103035017 | 4/2013 |

(Continued)

OTHER PUBLICATIONS

An, Yishuo. "Study of Parameter Mapping in Magnetic Resonance Imaging Based on Enhanced Compressed Sensing" master Degree Thesis of Jilin University, p. 39-45, Sep. 15, 2013.
(Continued)

*Primary Examiner* — Amy He
(74) *Attorney, Agent, or Firm* — Ladas & Parry, LLP

(57) ABSTRACT

Disclosed is a magnetic resonance rapid parameter imaging method and system. The method comprises: obtaining a target undersampled magnetic resonance signal (S10); obtaining prior information of a parameter model (S20); performing sequence reconstruction of a target image according to the undersampled magnetic resonance signal and the prior information to obtain a target image sequence (S30); and substituting the target image sequence into the parameter estimation model to obtain object parameters and to generate parametric images (S40).

4 Claims, 5 Drawing Sheets

(51) Int. Cl.
*G01R 33/56* (2006.01)
*G01R 33/50* (2006.01)

(58) Field of Classification Search
USPC .................................................. 324/309, 307
See application file for complete search history.

(56) References Cited

FOREIGN PATENT DOCUMENTS

| | | |
|---|---|---|
| CN | 103654789 | 3/2014 |
| CN | 103705239 | 4/2014 |
| WO | 2012/127341 | 9/2012 |

OTHER PUBLICATIONS

International Preliminary Report on Patentability (Chapter I) for PCT/CN2014/093168 dated Jun. 14, 2016 and its English translation provided by WIPO.
Written Opinion of the International Searching Authority for PCT/CN2014/093168 dated Mar. 18, 2015 and its English translation provided by WIPO.
International Search Report for PCT/CN2014/093168 dated Mar. 18, 2015 and its English translation provided by WIPO.

\* cited by examiner

MAGNETIC RESONANCE RAPID PARAMETER IMAGING METHOD AND SYSTEM

CROSS-REFERENCE TO RELATED APPLICATIONS

The present application is a national phase of PCT Application No. PCT/CN2014/093168 filed on Dec. 5, 2014, which claims the priority of the Chinese patent application No. 201310671860.3 filed on Dec. 10, 2013, which are incorporated herein by reference in their entireties.

TECHNICAL FIELD

The present disclosure relates to imaging filed, in particular to a fast magnetic resonance parameter imaging method and system.

BACKGROUND

Magnetic resonance imaging (MRI) is an imaging technology in which signals are generated through the resonance of atomic nucleuses in magnetic fields. Due to its safety and preciseness, magnetic resonance imaging is widely used in the imaging field. Magnetic resonance parameter mapping provides a way to quantitatively analyze the biochemical characteristics of tissues. However, magnetic resonance parameter mapping has a low imaging speed due to the requirement for collecting a series of images. Therefore, its clinical application is limited.

Compressed sensing technology is an advanced technology which can speed up the data acquisition of magnetic resonance imaging. A magnetic resonance parameter mapping method based on compressed sensing may include two steps: image series reconstruction and parameter estimation. Due to the presence of undersampling and measurement noise, reconstruction error will be inevitably generated in state-of-the-art compressed sensing based image reconstruction, thereby the accuracy of the parameter estimation will be affected.

SUMMARY

Therefore, it is desired to, for addressing the issue of the speed and inaccuracy of magnetic resonance parameter mapping, provide a fast magnetic resonance parameter imaging method which can increase the accuracy of magnetic resonance parameter mapping.

Furthermore, it is also desired to provide a fast magnetic resonance parameter mapping system which can increase the accuracy of magnetic resonance parameter mapping.

A fast magnetic resonance parameter imaging method is provided.
The method may include:
obtaining undersampled magnetic resonance signals of a target;
obtaining prior information of a parametric model;
performing reconstruction of target images according to the undersampled magnetic resonance signals and the prior information to obtain a target image series; and
substituting the target image series into a parameter estimation model to obtain the target parameters and generate a parameter map.

In an embodiment, performing the reconstruction of the target images according to the undersampled magnetic resonance signals and the prior information to obtain the target image series may include:

initializing a series of the target images by a zero-padding Fourier transform; and
reconstructing the initialized image series with a method based on non-linear filtering to obtain the target image series.

In an embodiment, reconstructing the initialized series of the target images with a method based on a non-linear filtering to obtain the target image series may include:
performing a soft thresholding on the coefficients of the images series in a certain sparsifying transform domain based on a sparse sampling theory;
constructing a Hankel matrix using time signals corresponding to each spatial location of the target image series according to the parameter estimation model;
obtaining a low-rank approximation of the Hankel matrix to enforce the time signals corresponding to each spatial location of the target image series to attenuate exponentially;
substituting the undersampled magnetic resonance signals into the k-space of the target image series to make the target image series to be consistent with the undersampled magnetic resonance signals; and
repeating steps above until a convergence is achieved to obtain the target image series.

In an embodiment, obtaining a low-rank approximation of the Hankel matrix to enforce the time signals corresponding to each spatial location of the target image series to attenuate exponentially may include:
obtaining the low-rank approximation of the Hankel matrix by a singular value decomposition;
performing an average calculation in a counter-diagonal direction of the low-rank approximation matrix to enhance signals and restoring a Hankel structure of the low-rank approximation matrix; and
extracting the time signals corresponding to each spatial location of the target image series from the low-rank approximation Hankel matrix.

A fast magnetic resonance parameter imaging system is provided. The system may include:
a signal obtaining module which scans a target to obtain undersampled magnetic resonance signals;
a prior information obtaining module which obtains prior information of a parametric model;
an image reconstruction module which performs reconstruction of the target image series according to the undersampled magnetic resonance signals and the prior information to obtain a target image series; and
a parameter estimation module which substitutes the target image series into a parameter estimation model to obtain target parameters and generate a parameter map.

In an embodiment, the image reconstruction module may include: an initialization unit which initializes the target image series by a zero-padding Fourier transform; and
a calculation unit which reconstructs the initialized target image series with a method based on non-linear filtering to obtain the target image series.

In an embodiment, the calculation unit may include:
a sparse constraint unit which performs a soft thresholding on coefficients of the target image series in a certain sparsifying transform domain based on sparse sampling theory;
a matrix construction unit which constructs a Hankel matrix using time signals corresponding to each spatial location of the target image series according to the parameter estimation model;
a model constraint unit which obtains a low-rank approximation of the Hankel matrix to enforce the time signals corresponding to each spatial location of the target image series to attenuate exponentially; and a signal fidelity unit which substitutes the undersampled magnetic resonance signals into the k-space of the target image series to make the target image series to be consistent with the undersampled magnetic resonance signals; where the calculation unit performs the calculations of the sparse constraint unit, the matrix construction unit, the model constraint unit and the signal fidelity unit repeatedly until the target image series converges to obtain a final target image series.

In an embodiment, the model constraint unit may include:

a low-rank approximation matrix obtaining unit which obtains the low-rank approximation of the Hankel matrix by a singular value decomposition;

a Hankel matrix restoration unit which performs an average calculation in a counter-diagonal direction of the low-rank approximation matrix to enhance signals and restores a Hankel structure of the low-rank approximation matrix; and a signal extraction unit which extracts the time signals corresponding to each spatial location of the target image series from the low-rank approximation Hankel matrix.

In the fast magnetic resonance parameter mapping method and system described above, the reconstruction of the target image series is performed using the undersampled magnetic resonance signals and the prior information extracted from the parametric model. The target image series is substituted into the parameter estimation model to generate the parameter map. Because the prior information of the parametric model is introduced into the reconstruction of the image series, the reconstruction errors generated during the reconstruction using compressed sensing can be corrected and the accuracy of the parameter map generated through the parameter estimation model can be increased.

DETAILED DESCRIPTION

Figure 1:
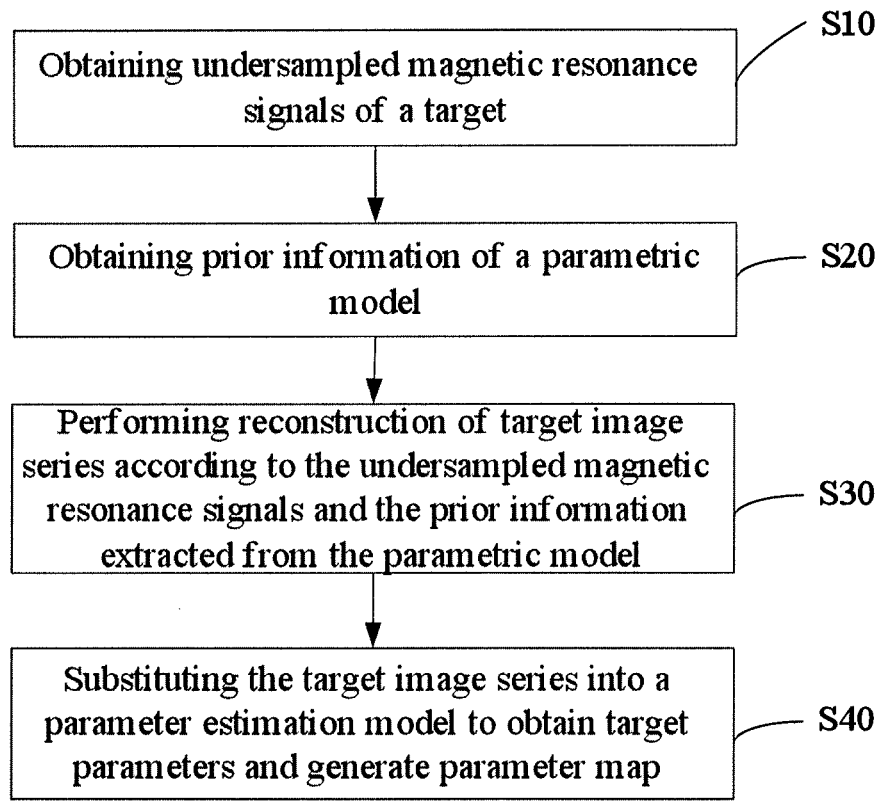
FIG. 1 is a flow chart of a fast magnetic resonance parameter mapping method according to an embodiment.

As shown in FIG. 1, in an embodiment, a fast magnetic resonance parameter mapping method may include following steps.

Step S10, obtaining undersampled magnetic resonance signals of a target.

Specifically, the undersampled magnetic resonance signals may be obtained by scanning the target using a magnetic resonance scanner, based on the sparse sampling theory.

Step S20, obtaining prior information of a parametric model.

In the present embodiment, the parameter may be pre-defined as T2 parameter, i.e. the transverse relaxation time. Magnetic resonance imaging (MRI) is an imaging technology in which images are obtained by reconstructing signals generated through the resonance of atomic nucleuses in magnetic fields. The time intervals between the pulses excited repeatedly is referred to as repetition time (TR), and the time from transmission of the RF pulses to the collection of the echo signals is referred to as echo delay time (TE). In order to estimate the parameters of the tissue being examined, images in which certain tissue characteristic parameters are highlighted may be obtained by adjusting the repetition time TR and the echo delay time TE. These images are referred to as weighted images. With the excitation of the RF pulses, the protons in the tissues of human body absorb energy and are in an excited state; after the RF pulses are terminated, the protons in the excited state restore to their original state. This process is referred to as relaxation. T2 weighted image refers to weighted image in which T2 relaxation (transverse relaxation) difference of the tissues is highlighted.

The T2 weighted magnetic resonance image series generally satisfies an exponentially decreasing relationship as following:

$$\rho_n(r) = \sum_{l=1}^{L} \rho_{o,l}(r) e^{-n\Delta TE/T_{2l}(r)} \tag{1}$$

where $\rho_{o,l}$ is the density distribution of the protons of the l-th water component, $\rho_n$ is the T2 weighted image corresponding to the n-th echo delay time, r is the spatial coordinate, $\Delta TE$ is the echo interval, and $T_{2l}$ is the T2 value of the protons of the l-th water component. In general, L is in the range of 1~3.

The prior information may refer to all prior knowledge about the signal characteristics, such as sparsity, smoothness and exponential attenuation characteristics, etc. In the present embodiment, the exponential attenuation characteristics of the T2 weighted image series is determined by the physical model of the signal and belongs to the prior knowledge which can be previously obtained, i.e. belongs to the prior information needed.

Step S30, performing reconstruction of target image series according to the undersampled magnetic resonance signals and the prior information extracted from the parametric model.

Performing the reconstruction of the target image series using the prior information and the undersampled magnetic resonance signals can obtain the target image series. In the present embodiment, because the prior information of the T2 parameters are introduced into the reconstruction of the target image series, the errors generated during the reconstruction of the T2-weighted image series can be reduced and the results of the T2 parameter estimation can be more accurate.

Step S40, substituting the target image series into a parameter estimation model to obtain target parameters and generate parameter map.

In the present embodiment, under an assumption that the noise is Gaussian noise, the T2 weighted image series may be substituted into formula (1) and the T2 parameters can be obtained using a least squares method. And then, the parameter map can be generated.

In other embodiments, the methods according to the present disclosure may also be used in imaging of other parameters, such as T2 parameter mapping based on single exponential or multi-exponential model, T2* parameter mapping, T1ρ mapping caused by the interaction between water molecules and surrounding macromolecules or myeline water fraction mapping, etc.

Figure 2:
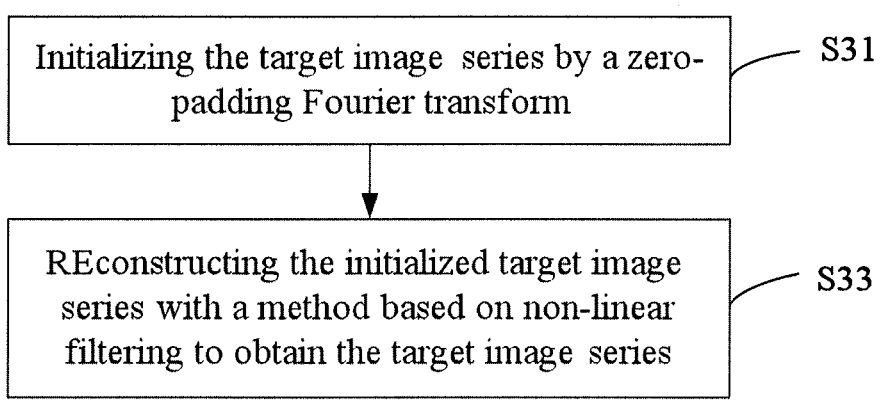
FIG. 2 is a flow chart of a method for performing the reconstruction of the target image series according to the undersampled magnetic resonance signals and the priori information to obtain a target image series according to an embodiment.

As shown in FIG. 2, in an embodiment, the step S30 may include following steps.

Step S31: initializing the target image series by a zero-padding Fourier transform.

In the present embodiment, the target image series may be initialized by a zero-padding FFT method: $\rho^{(0)}=F^H W^H y$, where $\rho^{(0)}$ is the target image series initialized, y is the undersampled k-space data, F is a Fourier transform matrix, W is a undersampling operator, and H represents a conjugate transpose.

Step S33: reconstructing the initialized target image series with a method based on non-linear filtering to obtain the target image series.

Specifically, in the present embodiment, i.e., T2 parameter mapping, the time signals corresponding to each spatial location of the target image series may be arranged as following according to the T2 parameter estimation model:

$$H = \begin{bmatrix} \rho_1(r) & \rho_2(r) & \cdots & \rho_K(r) \\ \rho_2(r) & \rho_3(r) & \cdots & \rho_{K+1}(r) \\ \vdots & \vdots & \vdots & \vdots \\ \rho_{M-K+1}(r) & \rho_{M-K+2}(r) & \cdots & \rho_M(r) \end{bmatrix}$$

The matrix above is referred to as Hankel matrix, where M is the total number of echo delay times, i.e. the number of images in the image series. As long as the image series satisfies formula (1), the Hankel matrix above is a low-rank matrix and the rank thereof is L.

The T2 image series may be obtained by introducing the rank of the Hankel matrix into the reconstruction of the target image series as constraints and solving with a method based on non-linear filtering. The formula for solving may be:

$$\min_\rho |\Psi B \rho|_1 \quad (2)$$
$$\text{s.t.} \quad \|y - WF\rho\|_2^2 \leq \varepsilon$$
$$\text{rank}(H[\rho_1(r), \rho_2(r), \cdots, \rho_M(r)]) = L, \forall r \in \Omega$$

where ρ is the target image series, y is the undersampled k-space data, F is the Fourier transform matrix, W is the undersampling operator, B is a sparsifying transform matrix along temporal dimension (for example, the principal component analysis), and Ψ is a sparsifying transform matrix in image domain (for example, the wavelet transform). ε controls the distance between the reconstructed image and the sampled data, which usually is proportional to the noise level. The function $H[\rho_1(r), \rho_2(r), \ldots, \rho_M(r)]$ represents the calculation for generating the Hankel matrix, and Ω represents the collection of coordinate points in image domain.

Figure 3:
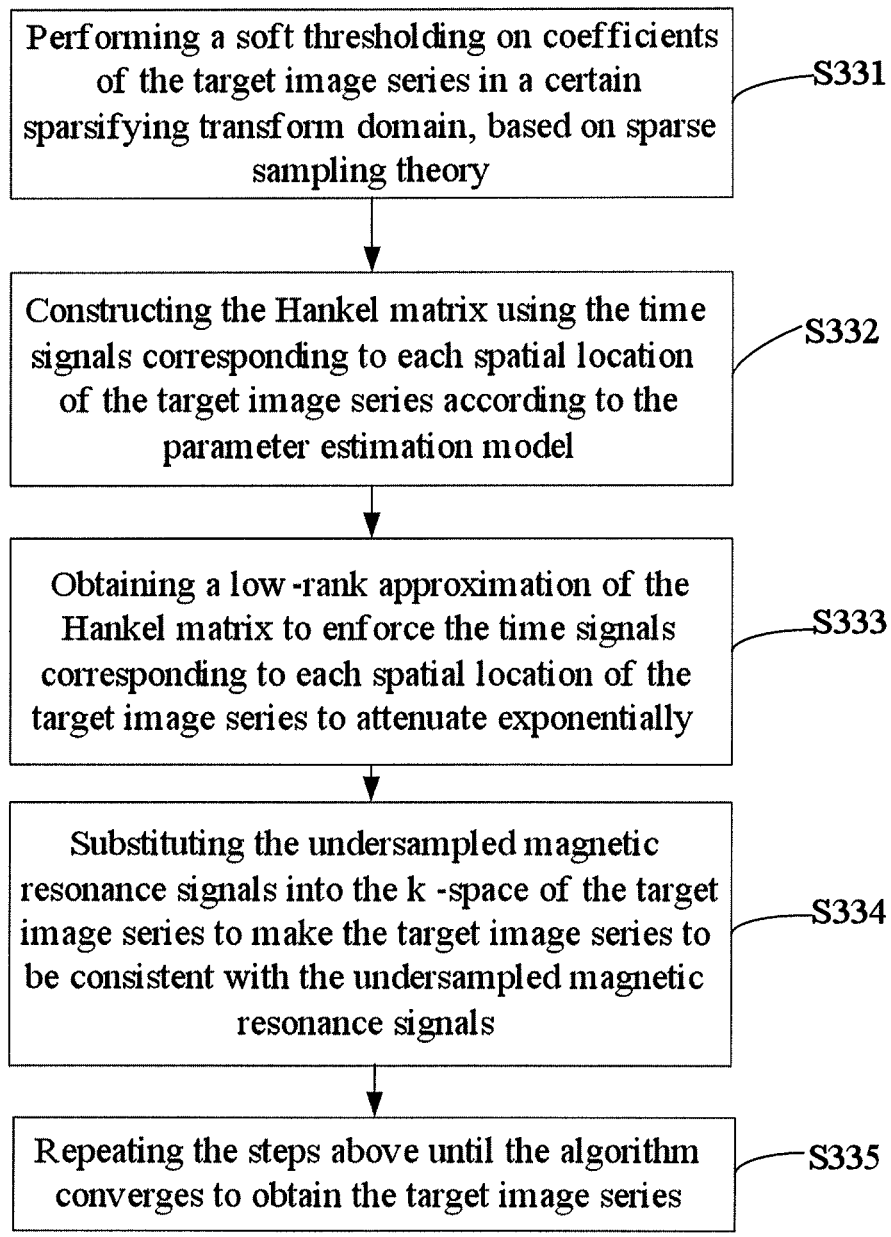
FIG. 3 is a flow chart of a method for reconstructing the target image series with a method based on nonlinear filtering to obtain the target image series according to an embodiment.

As shown in FIG. 3, in an embodiment, the step S33 may include following steps.

Step S331: performing a soft thresholding on coefficients of the target image series in a certain sparsifying transform domain, based on sparse sampling theory.

In the present embodiment, with the soft thresholding performed on the coefficients of the target image series in a certain sparsifying transform domain (i.e., PCA and wavelet transform), the target image series become sparse.

Specifically, iterations may be performed on the target image series using following formulas:

$$\alpha^{(k)} = \Psi B \rho^{(k)}, \quad (a)$$

$$\alpha^{(k+1)} = \text{SoftThresholding}(\alpha^{(k)}, \tau), \quad (b)$$

$$\rho^{(k+1)} = B^H 105^H \alpha^{(k+1)}, \quad (c)$$

where α is the coefficient of the transform domain, ρ is the target image series, B is the sparsifying transform matrix along the temporal dimension (for example, the PCA transform), Ψ is the sparsifying transform matrix in image domain (for example, the wavelet transform), the superscript k represents k-th iteration, and the SoftThresholding( ) represents the soft thresholding function, where the threshold is τ.

Step S332: constructing the Hankel matrix using the time signals corresponding to each spatial location of the target image series according to the parameter estimation model.

In the present embodiment, the time signals corresponding to each spatial location of the target image series may be arranged as following according to the T2 parameter estimation model:

$$H = \begin{bmatrix} \rho_1(r) & \rho_2(r) & \cdots & \rho_K(r) \\ \rho_2(r) & \rho_3(r) & \cdots & \rho_{K+1}(r) \\ \vdots & \vdots & \vdots & \vdots \\ \rho_{M-K+1}(r) & \rho_{M-K+2}(r) & \cdots & \rho_M(r) \end{bmatrix}$$

where M is the total number of the echo delay times, i.e. the number of images in the image series. As long as the image series satisfies formula (1), the Hankel matrix above is a low-rank matrix and the rank thereof is L.

Step S333: obtaining a low-rank approximation of the Hankel matrix to enforce the time signals corresponding to each spatial location of the target image series to attenuate exponentially.

In the present embodiment, the low-rank approximation of the Hankel matrix may be obtained, where the rank of the Hankel matrix may be selected according to the parameter estimation model and the exponential attenuation signals corresponding to the spatial locations of the image series may be extracted from the low-rank approximation matrix of the Hankel matrix.

Step S334: substituting the undersampled magnetic resonance signals into the k-space of the target image series to make the target image series to be consistent with the undersampled magnetic resonance signals.

In the present embodiment, a formula $\tilde{\rho}^{(k+1)} = W_c F \tilde{\rho}^{(k)} + y$ may be used to make the undersampled magnetic resonance signals to be consistent with the k-space data of the target image series, where y is the undersampled k-space data, F is the Fourier transform matrix, and $W_c$ represents a matrix calculation for selecting undersampled locations of the k-space.

Step S335: repeating the steps above until the algorithm converges to obtain the target image series.

In the present embodiment, the step S331, the step S332, the step S333 and the step S334 may be performed repeatedly until the algorithm for obtaining the target image series converges to obtain the final target image series.

Figure 4:
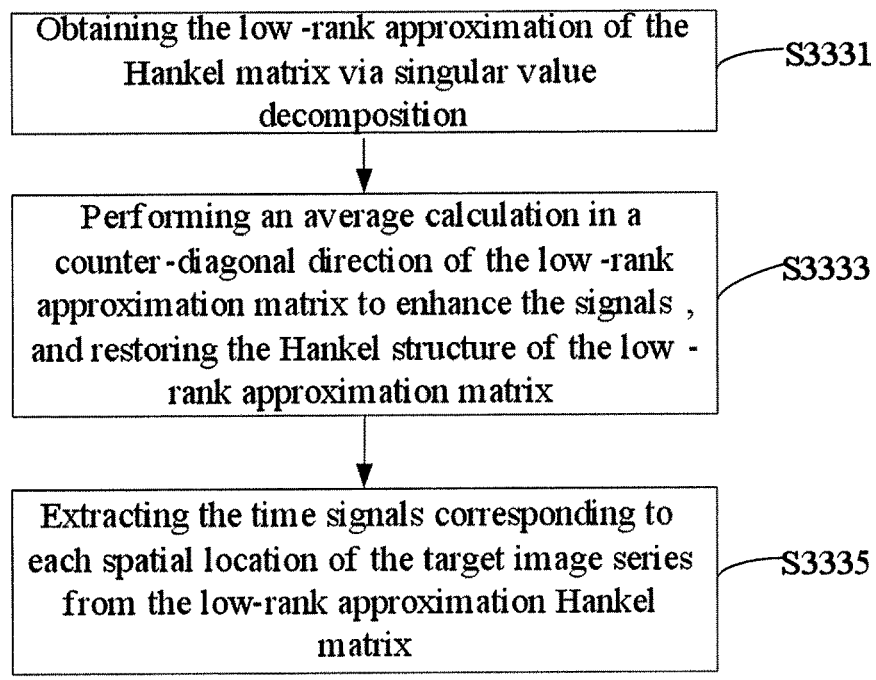
FIG. 4 is a flow chart of a method for obtaining a low-rank approximation of a Hankel matrix such that the time signals corresponding to each spatial location of the target image series exponentially attenuate according to an embodiment.

As shown in FIG. 4, in an embodiment, the step S333 may include following steps.

Step S3331: obtaining the low-rank approximation of the Hankel matrix via singular value decomposition.

In the present embodiment, the singular value decomposition may be performed on the Hankel matrix using a formula [USV]=svd(H), where U is a left singular value vector matrix, V is a right singular value vector matrix, and S (which is a diagonal matrix) is a singular value matrix. Assuming that $u_k$ represents the k-th column of U, $v_k$ represents the k-th column of V, and $\sigma_k$ is the k-th singular value, the low-rank approximation matrix may be generated by the top-L singular values and the singular vectors. The low-rank approximation matrix may be expressed as $\tilde{H}=\Sigma_{k=1}^{L} u_k \sigma_k v_k^T$.

Step S3333: performing an average calculation in a counter-diagonal direction of the low-rank approximation matrix to enhance the signals, and restoring the Hankel structure of the low-rank approximation matrix.

Step S3335: extracting the time signals corresponding to each spatial location of the target image series from the low-rank approximation Hankel matrix.

In the present embodiment, the average calculation may be performed in the counter-diagonal direction of the low-rank approximation matrix to enhance the signals and the Hankel structure of the low-rank approximation matrix may be restored, and the time signals corresponding to each spatial location of the target image series may be extracted from the low-rank approximation Hankel matrix.

In the methods described above, by constraining the low-rank characteristics of the Hankel matrix generated by the image series, the prior information of the parameters is introduced into the reconstruction of the image series as prior knowledge. Thereby the errors generated during the reconstruction are corrected and the accuracy of the parameter map generated through the parameter estimation model is increased.

Figure 5:
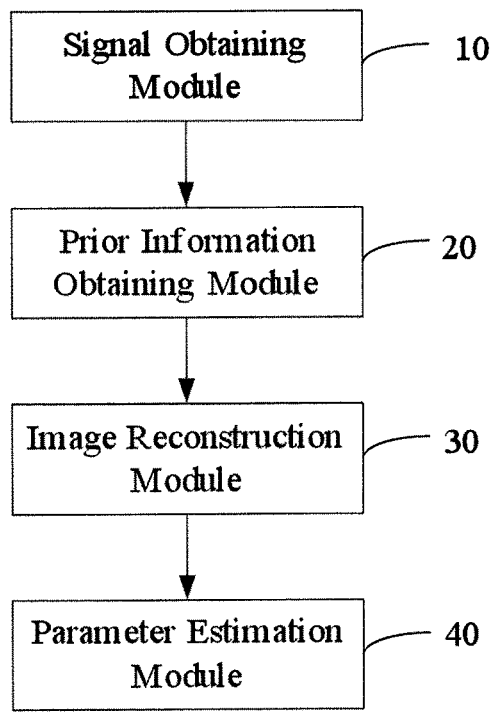
FIG. 5 is a schematic view showing the structure of a magnetic resonance parameter mapping system according to an embodiment.

As shown in FIG. 5, a fast magnetic resonance parameter mapping system may include a signal obtaining module 10, a prior information obtaining module 20, an image reconstruction module 30 and a parameter estimation module 40.

The signal obtaining module 10 may scan the target to obtain the undersampled magnetic resonance signals.

In the present embodiment, a magnetic resonance scanner may be used to scan the target to obtain the undersampled magnetic resonance signals of the target.

The prior information obtaining module 20 may obtain the prior information of the parametric model.

In the present embodiment, the T2 parameter is taken as an example.

The T2 weighted magnetic resonance image sequence generally satisfies an exponentially decreasing relationship as following:

$$\rho_n(r) = \sum_{l=1}^{L} \rho_{o,l}(r) e^{-n\Delta TE/T_{2l}(r)} \quad (1)$$

where $\rho_{o,l}$ is the density distribution of the protons of the l-th water component, $\rho_n$ is the T2 weighted image corresponding to the n-th echo delay time, r is the spatial coordinate, $\Delta TE$ is the echo interval, and $T_{2l}$ is the T2 value of the protons of the l-th water component. In general, L is in the range of 1~3.

The prior information may refer to all prior knowledge about the signal characteristics, such as sparsity, smoothness and exponential attenuation characteristics, etc. In the present embodiment, the exponential attenuation characteristics of the T2 weighted image series is determined by the physical model of the signal and belongs to the prior knowledge which can be previously obtained, i.e. belongs to the prior information needed.

The image reconstruction module 30 may performing the reconstruction of the target images according to the undersampled magnetic resonance signals and the prior information extracted from the parametric model.

Performing the reconstruction of the target images using the prior information and the undersampled magnetic resonance signals can obtain the target image series. In the present embodiment, because the previously obtainable information of the T2 parameter estimation are introduced into the reconstruction of the target images, the errors generated during the reconstruction of the image series can be further reduced such that the parameter estimation can be more accurate.

The parameter estimation module 40 may substitute the target image series into the parameter estimation model to obtain the target parameters and generate the parameter maps.

In the present embodiment, under an assumption that the noise is Gaussian noise, the T2 weighted image series may be substituted into the formula (1) and the T2 parameters may be obtained using a least squares method. And then, the parameter map may be generated.

In other embodiments, the methods according to the present disclosure may also be used in imaging of other parameters, such as T2 parameter mapping based on single exponential or multi-exponential model, T2* parameter imaging, T1ρ mapping caused by the interaction between water molecules and surrounding macromolecules or myeline water fraction mapping, etc.

Figure 6:
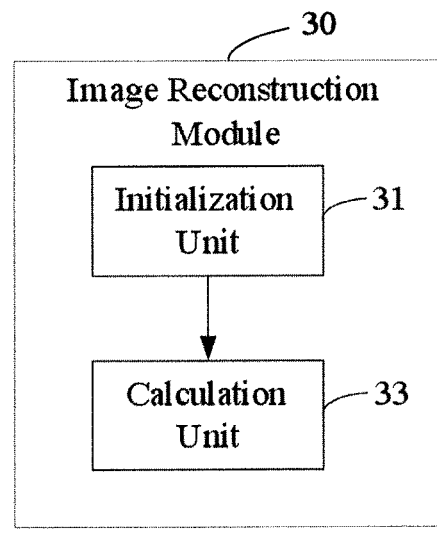
FIG. 6 is a schematic view showing the structure of an image reconstruction module according to an embodiment.

As shown in FIG. 6, in an embodiment, the image reconstruction module 30 may include following units.

An initialization unit 31 which may initialize the target image series by the zero-padding Fourier transform.

In the present embodiment, the target image series may be initialized by the zero-padding FFT method: $\rho^{(0)}=F^H W^H y$, where $\rho^{(0)}$ is the target image series initialized, y is the undersampled k-space data, F is the Fourier transform matrix, W is the undersampling operator, and H represents the conjugate transpose.

A calculation unit 33 which may reconstruct the initialized target image series with a method based on non-linear filtering to obtain the target image series.

Specifically, in the case of T2 parameter mapping, the time signals corresponding to each spatial location of the target image series may be arranged as following according to the T2 parameter estimation model:

$$H = \begin{bmatrix} \rho_1(r) & \rho_2(r) & \cdots & \rho_K(r) \\ \rho_2(r) & \rho_3(r) & \cdots & \rho_{K+1}(r) \\ \vdots & \vdots & \vdots & \vdots \\ \rho_{M-K+1}(r) & \rho_{M-K+2}(r) & \cdots & \rho_M(r) \end{bmatrix}$$

The matrix above is referred to as Hankel matrix, where M is the total number of the echo delay times, i.e. the number of images in the image series. As long as the image series satisfies the formula (1), the Hankel matrix above is a low-rank matrix and the rank thereof is L.

The T2-weighted image series may be obtained by introducing the rank of the Hankel matrix into the reconstruction model of the target image series as constraints and solving with a method based on non-linear filtering. The formula for solving may be expressed as:

$$\min_{\rho} |\Psi B\rho|_1 \quad (2)$$
$$\text{s.t.} \quad \|y - WF\rho\|_2^2 \leq \varepsilon$$
$$\text{rank}(H[\rho_1(r), \rho_2(r), \cdots, \rho_M(r)]) = L, \forall r \in \Omega$$

where $\rho$ is the target image series, y is the undersampled k-space data, F is the Fourier transform matrix, W is the undersampling operator, B is the sparsifying transform matrix along temporal dimension (for example, the principal component analysis), and $\Psi$ is the sparsifying transform matrix in image domain (for example, the wavelet transform). $\varepsilon$ controls the distance between the reconstructed image and the sampled data, which usually is proportional to the noise level. The function $H[\rho_1(r), \rho_2(r), \ldots, \rho_M(r)]$ represents the calculation for generating the Hankel matrix, and $\Omega$ represents the collection of coordinate points in image domain.

Figure 7:
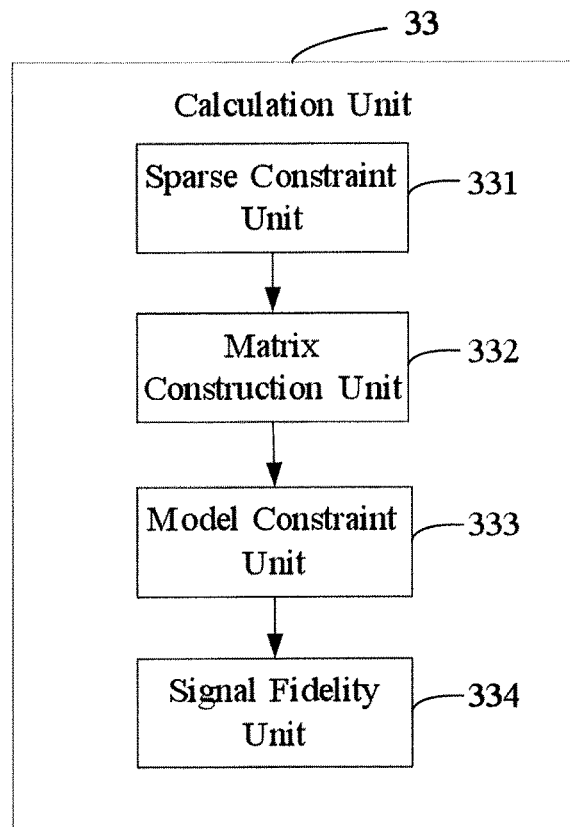
FIG. 7 is a schematic view showing the structure of a calculation unit in the image reconstruction module according to an embodiment.

As shown in FIG. 7, in an embodiment, the calculation unit 33 may include following units.

A sparse constraint unit 331 which may perform the soft thresholding on the coefficients of the target image series in certain sparsifying transform domain, based on sparse sampling theory.

In the present embodiment, with the soft thresholding performed on the coefficients of the target image series in certain sparsifying transform domain (i.e., PCA and wavelet transform), the target image series become sparse.

Specifically, iterations may be performed on the target image series using following formulas:

$$\alpha^{(k)} = \Psi B \rho^{(k)}, \quad (a)$$

$$\alpha^{(k+1)} = \text{SoftThresholding}(\alpha^{(k)}, \tau), \quad (b)$$

$$\rho^{(k+1)} = B^H \Psi^H \alpha^{(k+1)}, \quad (c)$$

where $\alpha$ is the coefficient in the transform domain, $\rho$ is the target image series, B is the sparsifying transform matrix along the temporal dimension (for example, PCA), $\Psi$ is the sparsifying transform matrix in image domain (for example, wavelet transform), the superscript k represents k-th iteration, and the SoftThresholding( ) represents the soft thresholding function, where the threshold is $\tau$.

A matrix construction unit 332 which may construct the Hankel matrix using the time signals corresponding to each spatial location of the target image series according to the parameter estimation model.

In the present embodiment, the time signals corresponding to each spatial location of the target image series may be arranged as following according to the T2 parameter estimation model:

$$H = \begin{bmatrix} \rho_1(r) & \rho_2(r) & \cdots & \rho_K(r) \\ \rho_2(r) & \rho_3(r) & \cdots & \rho_{K+1}(r) \\ \vdots & \vdots & \vdots & \vdots \\ \rho_{M-K+1}(r) & \rho_{M-K+2}(r) & \cdots & \rho_M(r) \end{bmatrix}$$

where M is the total number of the echo delay times, i.e. the number of images in the image series. As long as the image sequence satisfies the formula (1), the Hankel matrix above is a low-rank matrix and the rank thereof is L.

A model constraint unit 333 which may obtain the low-rank approximation of the Hankel matrix to enforce the time signals corresponding to each spatial location of the target image series to attenuate exponentially.

In the present embodiment, the low-rank approximation Hankel matrix of the Hankel matrix may be obtained, where the rank of the Hankel matrix may be selected according to the parameter estimation model and the exponential attenuation signals corresponding to the spatial locations of the image series may be extracted from the low-rank approximation of the Hankel matrix.

A signal fidelity unit 334 which may substitute the undersampled magnetic resonance signals into the k-space of the target image series to make the target image series to be consistent with the undersampled magnetic resonance signals.

In the present embodiment, a formula $\tilde{\rho}^{(k+1)} = W_c F \tilde{\rho}^{(k)} + y$ may be used to make the undersampled magnetic resonance signals to be consistent with the k-space data of the target image series, where y is the undersampled k-space data, F is the Fourier transform matrix, and $W_c$ represents a matrix calculation for selecting the unsampled locations of the k-space.

The calculation unit 33 may perform the calculation of the sparse constraint unit 331, the matrix construction unit 332, the model constraint unit 333 and the signal fidelity unit 334 repeatedly until the target image series converges to obtain the final target image series.

Figure 8:
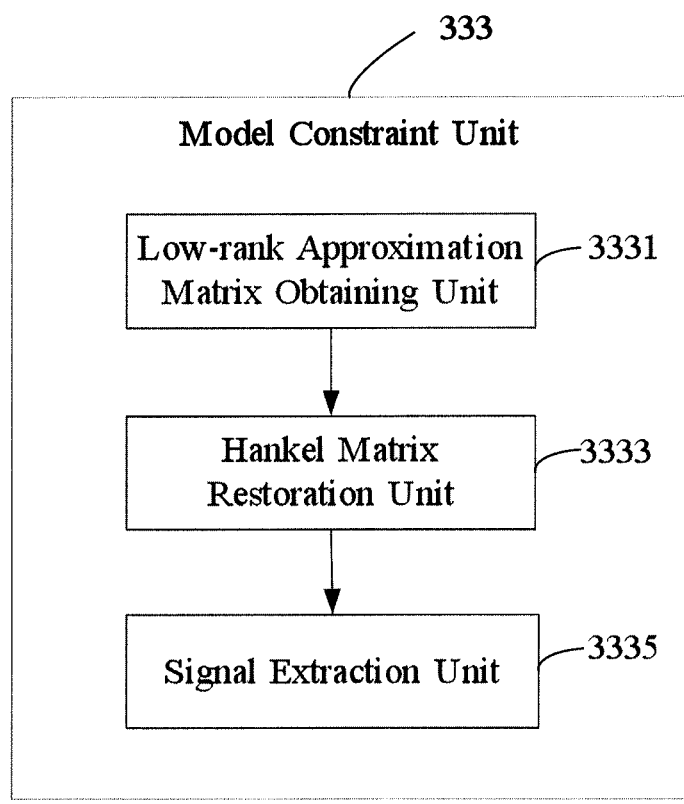
FIG. 8 is a schematic view showing the structure of a model constraint unit in the calculation unit according to an embodiment.

As shown in FIG. 8, in an embodiment, the model constraint unit 333 may include following units.

A low-rank approximation matrix obtaining unit 3331 which may obtain the low-rank approximation of the Hankel matrix by the singular value decomposition.

In the present embodiment, the singular value decomposition may be performed on the Hankel matrix using a formula [USV] = svd(H), where U is a left singular value vector matrix, V is a right singular value vector matrix, and S (which is a diagonal matrix) is a singular value matrix. Assuming that $u_k$ represents the k-th column of U, $v_k$ represents the k-th column of V, and $\sigma_k$ is the k-th singular value, the low-rank approximation matrix may be generated by the top-L singular values and the singular vectors. The low-rank approximation matrix may be expressed as $\tilde{H} = \Sigma_{k=1}^{L} u_k \sigma_k v_k^T$.

A Hankel matrix restoration unit 3333 which may perform the average calculation in the counter-diagonal direction of the low-rank approximation matrix to enhance the signals and restore the Hankel structure of the low-rank approximation matrix.

A signal extraction unit 3335 which may extract the time signals corresponding to each spatial location of the target image series from the low-rank approximation Hankel matrix.

In the present embodiment, the average calculation may be performed in a counter-diagonal direction of the low-rank approximation matrix to enhance the signals and the Hankel structure of the low-rank approximation matrix may be restored, and the time signals corresponding to each spatial location of the target image series may be extracted from the low-rank approximation Hankel matrix.

In the methods described above, the exponential attenuation signals are introduced into the reconstruction of the image series as prior knowledge by constraining the low-rank characteristics of the Hankel matrix generated by the image series. Thereby the errors generated during the reconstruction of the image series are corrected and the accuracy of the parameter map generated through the parameter estimation model is increased.

The embodiments above have described several implementations of the present disclosure specifically and in details. However, they should not be interpreted as limitations to the scope of the present disclosure. It should be noted that many modifications and improvements can be made by a person ordinarily skilled in the art without departing from the concepts of the present disclosure, which all fall within the protection scope of the present disclosure. Therefore, the protection scope of the present disclosure should be defined by attached claims.

We claim:

1. A fast magnetic resonance parameter mapping method, comprising:
    obtaining undersampled magnetic resonance signals of a target;
    obtaining prior information of a parametric model;
    performing reconstruction of the target image series according to the undersampled magnetic resonance signals and the prior information extracted from the parametric model; and
    substituting the target image series into a parameter estimation model to obtain target parameters and generate a parameter map;
        wherein performing reconstruction of the target image series according to the undersampled magnetic resonance signals and the prior information extracted from the parametric model comprises:
        initializing the target image series by a zero-padding Fourier transform; and
            reconstructing the initialized target image series with a method based on non-linear filtering to obtain the target image series;
            wherein reconstructing the initialized target image series with a method based on non-linear filtering to obtain the target image series comprises:
            performing a soft thresholding on coefficients of the target image series in a certain sparsifying transform domain based on sparse sampling theory;
            constructing a Hankel matrix using time signals corresponding to each spatial location of the target image series according to the parameter estimation model;
            obtaining a low-rank approximation of the Hankel matrix to enforce the time signals corresponding to each spatial location of the target image series to attenuate exponentially;
            substituting the undersampled magnetic resonance signals into the k-space of the target image series to make the target image series to be consistent with the undersampled magnetic resonance signals; and
            repeating steps above until convergence is achieved to obtain the target image series.

2. The method of claim 1, wherein obtaining a low-rank approximation of the Hankel matrix to enforce the time signals corresponding to each spatial location of the target image series to attenuate exponentially comprises:
    obtaining the low-rank approximation of the Hankel matrix by a singular value decomposition;
    performing an average calculation in a counter-diagonal direction of the low-rank approximation matrix to enhance signals and restoring the Hankel structure of the low-rank approximation matrix; and
    extracting the time signals corresponding to each spatial location of the target image series from the low-rank approximation Hankel matrix.

3. A fast magnetic resonance parameter mapping system, comprising:
    a signal obtaining module which scans a target to obtain undersampled magnetic resonance signals;
    a prior information obtaining module which obtains prior information of a parametric model;
    an image reconstruction module which performs reconstruction of the target image series according to the undersampled magnetic resonance signals and the prior information extracted from the parametric model; and
    a parameter estimation module which substitutes the target image series into a parameter estimation model to obtain target parameters and generate a parameter map;
    wherein the image reconstruction module comprises:
    an initialization unit which initializes the target image series by a zero-padding Fourier transform; and
    a calculation unit which reconstructs the initialized target image series with a method based on non-linear filtering to obtain the target image series;
        wherein the calculation unit comprises:
            a sparse constraint unit which performs a soft thresholding on coefficients of the target image series in certain sparsifying transform domain based on sparse sampling theory;
            a matrix construction unit which constructs a Hankel matrix using time signals corresponding to each spatial location of the target image series according to the parameter estimation model;
            a model constraint unit which obtains a low-rank approximation of the Hankel matrix to enforce the time signals corresponding to each spatial location of the target image series to attenuate exponentially; and
            a signal fidelity unit which substitutes the undersampled magnetic resonance signals into the k-space of the target image series to make the target image series to be consistent with the undersampled magnetic resonance signals;
        wherein the calculation unit performs calculations of the sparse constraint unit, the matrix construction unit, the model constraint unit and the signal fidelity unit repeatedly until the target image series converges to obtain a final target image series.

4. The system of claim 3, wherein the model constraint unit comprises:
    a low-rank approximation matrix obtaining unit which obtains the low-rank approximation of the Hankel matrix by a singular value decomposition;
    a Hankel matrix restoration unit which performs an average calculation in the counter-diagonal direction of the low-rank approximation matrix to enhance signals and restores the Hankel structure of the low-rank approximation matrix; and a signal extraction unit which extracts the time signals corresponding to each spatial location of the target image series from the low-rank approximation Hankel matrix.

* * * * *